US009377826B2

(12) United States Patent
Crisan et al.

(10) Patent No.: US 9,377,826 B2
(45) Date of Patent: Jun. 28, 2016

(54) HIGH-DENSITY BLADE WITH HOT EXTRACTION OF COMPONENTS FOR COMPUTER SYSTEM

(75) Inventors: Cornel Crisan, La Tronche (FR); Frederic Temporelli, Echirolles (FR)

(73) Assignee: BULL SAS, Les Clayes Sous Bois (FR)

( * ) Notice: Subject to any disclaimer, the term of this patent is extended or adjusted under 35 U.S.C. 154(b) by 0 days.

(21) Appl. No.: 13/636,329

(22) PCT Filed: Mar. 21, 2011

(86) PCT No.: PCT/FR2011/050566
§ 371 (c)(1),
(2), (4) Date: Sep. 20, 2012

(87) PCT Pub. No.: WO2011/117517
PCT Pub. Date: Sep. 29, 2011

(65) Prior Publication Data
US 2013/0002106 A1    Jan. 3, 2013

(30) Foreign Application Priority Data

Mar. 23, 2010    (FR) ...................................... 10 52099

(51) Int. Cl.
*H05K 7/14*    (2006.01)
*H05K 5/02*    (2006.01)
(Continued)

(52) U.S. Cl.
CPC .............. *G06F 1/187* (2013.01); *G11B 33/128* (2013.01); *H05K 7/1487* (2013.01)

(58) Field of Classification Search
CPC .... G06F 1/187; H05K 7/1487; H05K 7/1489; H05K 7/1491; H05K 7/1488; H05K 7/00; H05K 7/1454; H05K 7/1461; H05K 7/1474; G11B 33/128; G11B 33/127; G11B 33/125
USPC .......... 361/724–727, 679.37, 679.38, 679.39, 361/679.41
See application file for complete search history.

(56) References Cited

U.S. PATENT DOCUMENTS 7,864,538 B2 *    1/2011    Wadsworth et al. .......... 361/727
8,120,922 B2 *    2/2012    Randall et al. ................ 361/725
(Continued)

FOREIGN PATENT DOCUMENTS

JP    2003-036669 A    2/2003
JP    2006-235964 A    9/2006
WO    WO 2009/108205 A1    9/2009

OTHER PUBLICATIONS

PCT International Search Report for PCT Application No. PCT/FR2011/050566, mailed May 30, 2011.
(Continued)

*Primary Examiner* — Hoa C Nguyen
*Assistant Examiner* — Christopher L Augustin
(74) *Attorney, Agent, or Firm* — Pillsbury Winthrop Shaw Pittman LLP

(57) ABSTRACT

A blade of components for a computer system, intended to be inserted into a computer system rack, is disclosed. In one aspect, it includes a frame with means for electrically connecting to the computer rack, and a computer component holder having a plurality of through-slots configured to receive computer components translatably along the longitudinal direction of the slot. The component holder is movably mounted by means of a slide connection in relation to the frame, such that it can move between a first position in which the holder is inserted substantially into the frame and a second position in which the holder is at least partially removed from the frame, such that the vertical line of all of the slots is kept free along the longitudinal direction of each in order to allow the translatable insertion and extraction of computer components along the longitudinal direction.

7 Claims, 4 Drawing Sheets

Figure 1:
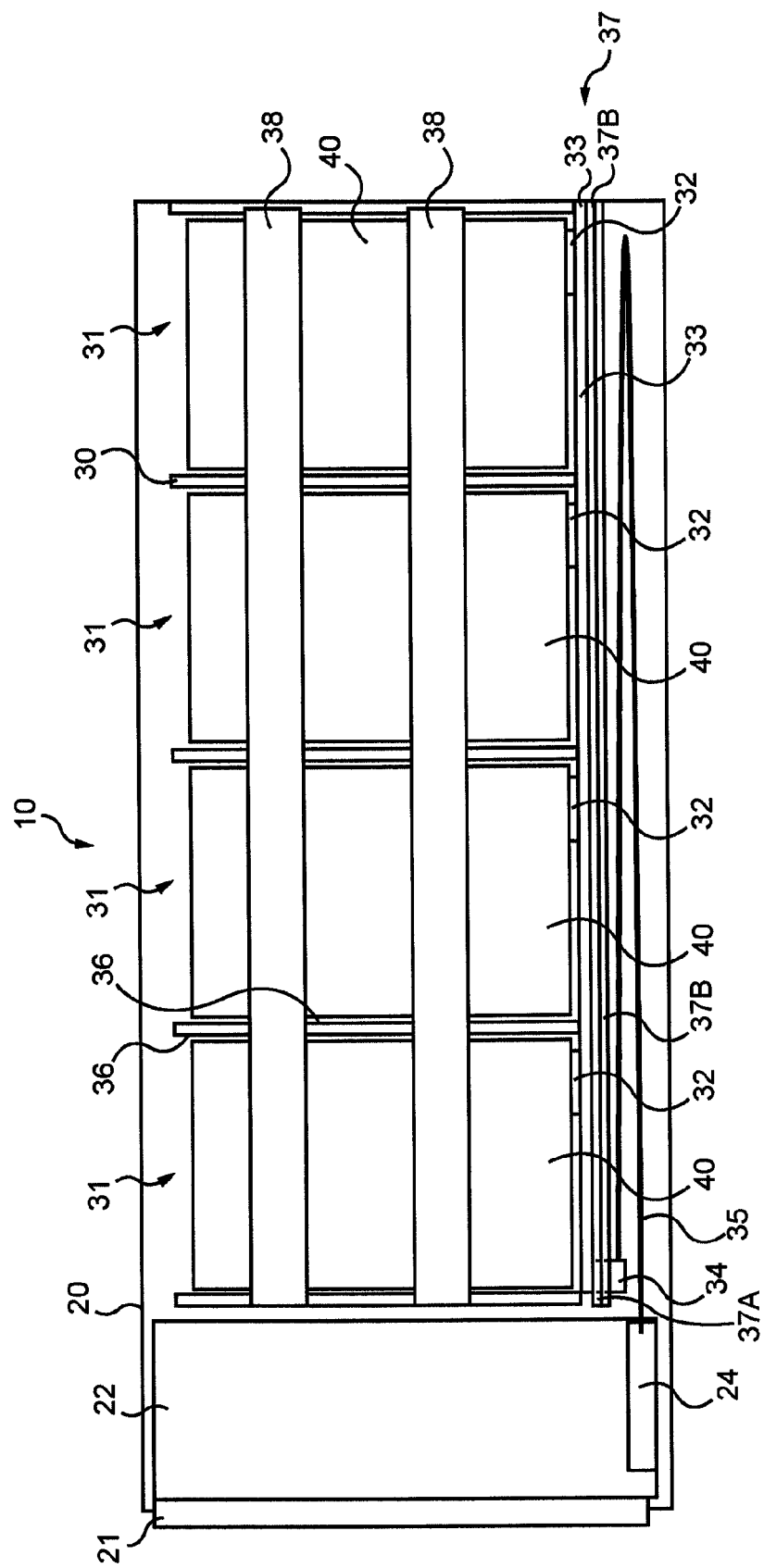

(51) Int. Cl.
*H05K 7/18* (2006.01)
*G06F 1/18* (2006.01)
*G11B 33/12* (2006.01)

(56) References Cited

U.S. PATENT DOCUMENTS

2007/0230110 A1 10/2007 Starr et al.
2008/0307141 A1 12/2008 Buchert
2010/0172087 A1* 7/2010 Jeffery et al. ............ 361/679.33
2011/0007464 A1* 1/2011 Leigh ....................... 361/679.01

OTHER PUBLICATIONS

English Translation of Examiner's Decision of Rejection dated Aug. 5, 2014 for Japanese Application No. JP 2013-500556, which shares priority of International Application No. PCT/FR2011/0505566, filed Mar. 21, 2011, with captioned U.S. Appl. No. 13/636,329, and cites the above-identified reference numbered 1.

* cited by examiner

HIGH-DENSITY BLADE WITH HOT EXTRACTION OF COMPONENTS FOR COMPUTER SYSTEM

CROSS-REFERENCE TO RELATED APPLICATIONS

This application is a U.S. National Phase under 35 U.S.C. §371 of International Application PCT/FR2011/050566, filed Mar. 21, 2011, which designated the U.S., and which claims priority under 35 U.S.C. §119 to French Patent Application Number 1052099, filed on Mar. 23, 2010. The disclosures of the above-described applications are hereby expressly incorporated by reference in their entireties.

The present invention generally relates to a computer system with a structure of blades which are disposed in cases.

More particularly, the present invention concerns blades for computer components, such as hard disks.

In the field of computer systems in general, systems are known having an architecture based on blades inserted into cases, the cases also being called racks. Each blade bears a certain number of computer components such as hard disks or electronic boards. The blades are inserted into the racks which have guide means for inserting the blades and connectors disposed in parallel on a back face of the rack to electrically connect each of the blades. On a back edge, the blades have connection regions configured to cooperate with the rack connectors.

When a computer component of one of the blades requires to be changed, the entire blade must be extracted, so depriving the computer system of the other components of the blade in question during the time of the intervention.

To mitigate this, it has been proposed to dispose the computer components in compartments opening on the front edge of the blade. This solution enables "hot" interchange of the computer components disposed in the compartments, that is to say without having to put all the components of the blade out of service. However, the number of components which it is possible to so dispose in the front compartments is limited by the area of the front edges of the blades, which is dictated by the size of the racks whose size is itself standardized. Furthermore, with this solution, some of the components of the blade that are situated behind the compartments remain inaccessible without demounting the blade.

The present invention aims to mitigate these drawbacks. To that end it provides a blade of components for a computer system, the blade being configured to be inserted into a computer system case, comprising a chassis with means for electrical connection to the computer system case, a support for computer components having a plurality of open locations adapted to receive computer components in translational movement in a longitudinal direction of the location, the component support being movably mounted via a slide link relative to the chassis, between a first position in which the support is substantially inserted into the chassis and a second position in which the support is at least partly extracted from the chassis, so as to leave clearance in line with the set of locations in the longitudinal direction of each of them to enable the insertion and the extraction of the computer components by translational movement in said longitudinal direction of each of the locations.

Thus, advantageously, the blade according to the invention makes it possible to maximize the number of components that are interchangeable within the same blade without having to extract the blade from the casing. This results in an increase in productivity in that the time of intervention on the system is limited and in that the other components of the blade continue to operate during the intervention with a minimum of impact on the performance of the computer system, and also results in an increase in the density of the components, the useful volume of the blade being greater. The terminology "high component density" and "hot" extraction of the components is used in this context.

According to advantageous features of the invention, which may be combined:

- each of the locations has a connector connected to the means for electrical connection of the chassis to the case, the connector being adapted to electrically connect the computer component at the time of its insertion into the location.
- the chassis comprises a control device for the electronic components which is linked to the means for electrical connection to the computer system case as well as being linked to the connectors for the locations of the support.
- the longitudinal directions of the locations are substantially parallel to each other, and the support has at least one electronic board which is substantially perpendicular to all said directions, said board bearing at least some of said connectors.
- the blade comprises a ribbon of electrical wires between the means for electrical connection to the computer system case and the connectors.
- the locations have means for translational guiding for the computer components.
- the slide link between the chassis and the support is provided by slide-forming devices disposed between the chassis and the support.
- stop-forming means are provided on the slide-forming devices to limit the travel of the support relative to the chassis to the path comprised between said first and said second position.
- at least one of the locations is adapted to receive a hard disk.

According to another aspect, the invention concerns a computer system comprising at least one blade, as described above.

Figure 2:
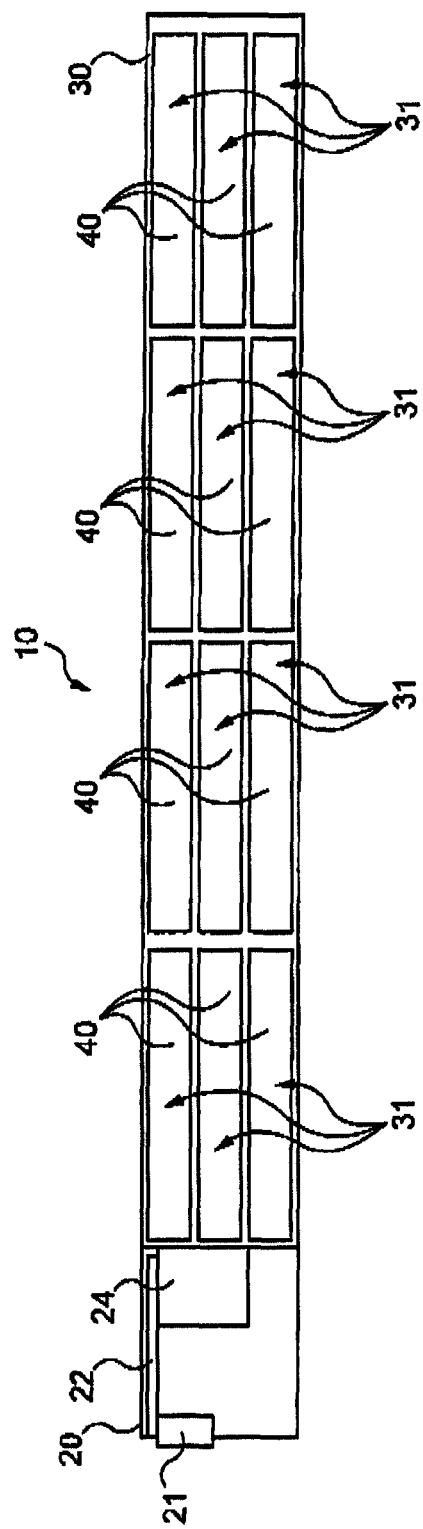
Figure 3:
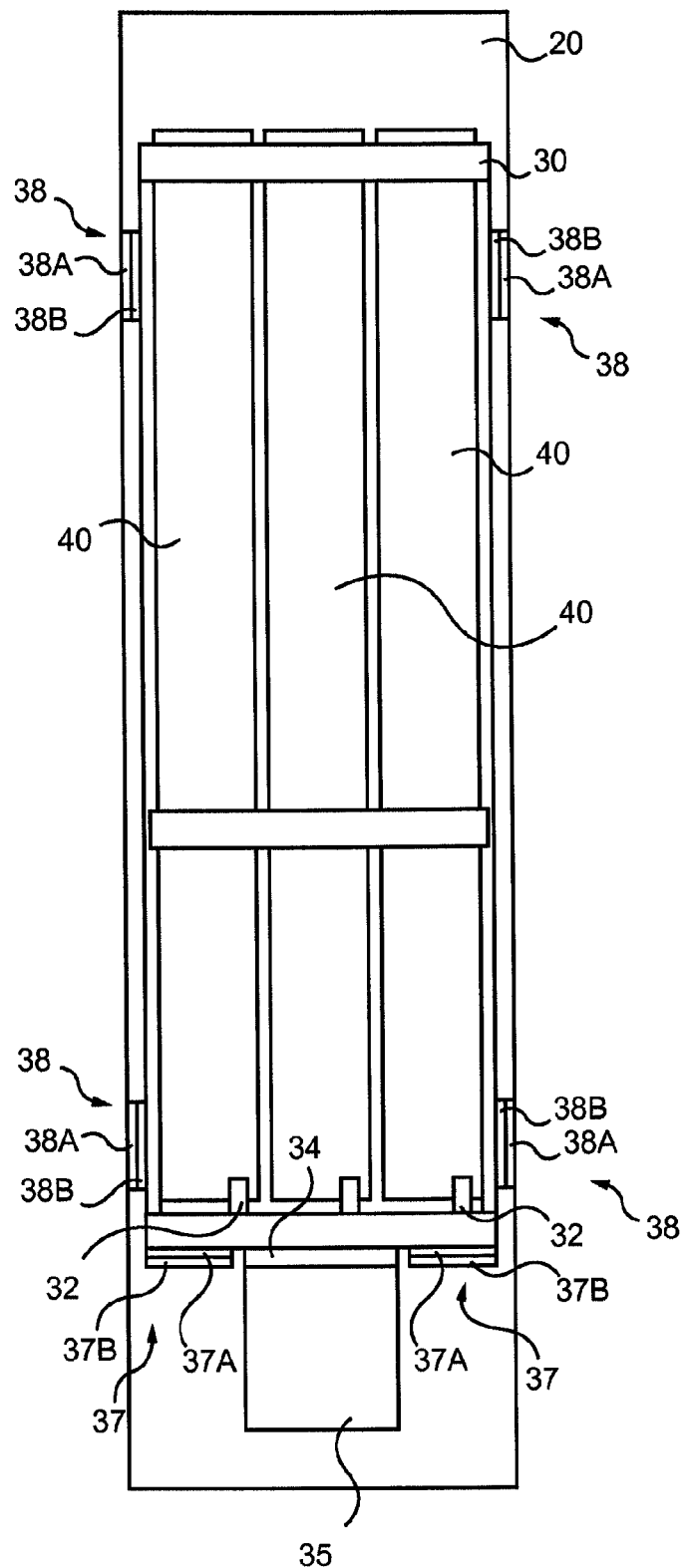
Figure 4:
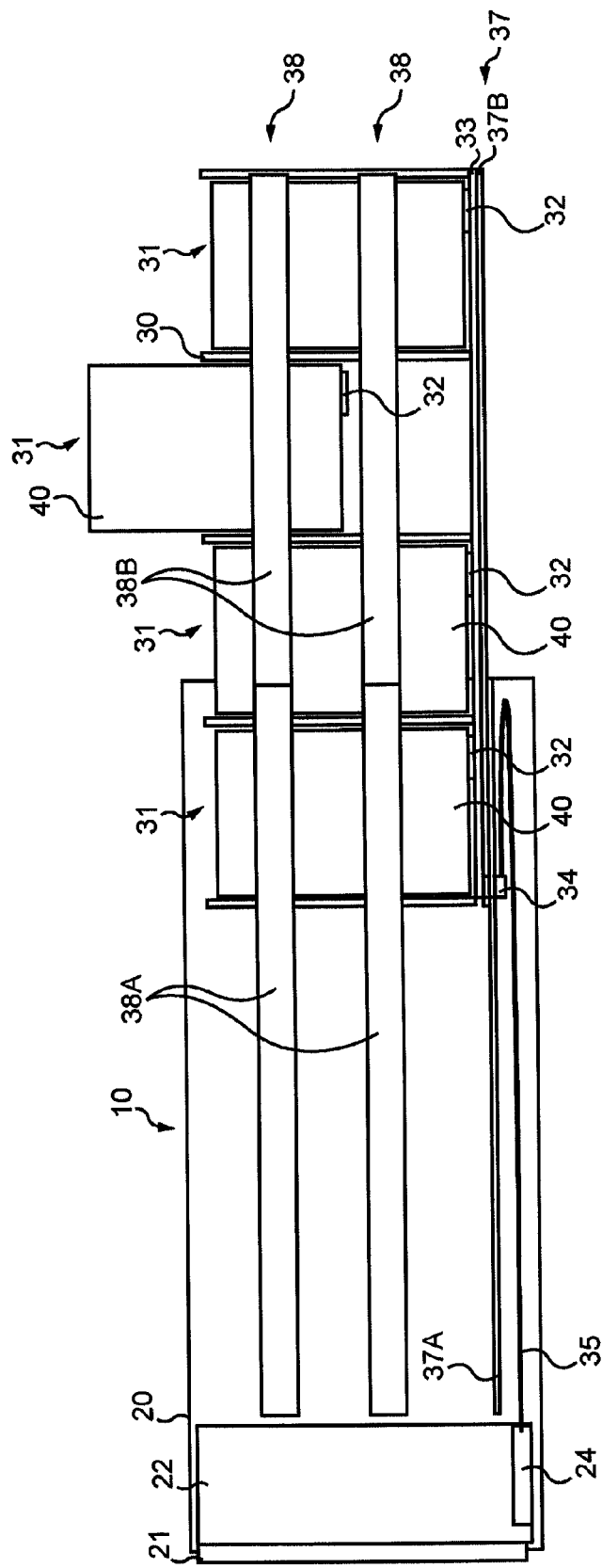

The invention will be better understood on reading the following description of an example embodiment of the invention, given by way of purely illustrative and non-limiting example, with reference to the accompanying drawings. In the drawings:

FIG. 1 is a side view of a blade according to the invention;
FIG. 2 is a view from above of the same blade;
FIG. 3 is a back view of the same blade;
FIG. 4 is a side view of the same blade in position for extraction of the components.

As can be seen more particularly in FIG. 1, a blade 10 of components 40 for a computer system according to the invention is dimensioned to be inserted into a computer system case (not shown).

The blade comprises a chassis 20 having means for electrical connection to the computer system case. In practice, this is a male connector 21 configured to cooperate with a female connector disposed in the computer system case (not shown).

The blade further comprises a support 30 for computer components having a backplane architecture forming twelve locations 31 for computer components 40 as can be seen especially in FIG. 2.

As can be seen in FIGS. 1 and 4, the support 30 is movably mounted via a slide link relative to the chassis 20.

Each of the locations 31 has, at its back, a connector 32 carried by an electronic board 33 disposed at the back of the component support substantially perpendicular to the longitudinal direction of each of the locations 31. The electronic board 33 has a connector 34 grouping together the connections of all the electronic equipment connectors 32. The connector 34 is then linked, using a ribbon 35 composed of a plurality of electrical wires, to a connector 24 disposed on an electronic board 22 of the chassis. The electronic board 22 of the chassis constitutes a control device for the various electronic components which are connected thereto via the ribbon 35. The electronic board 22 furthermore bears the connector 21 configured to connect the blade to the computer system case. This can be seen more particularly in FIGS. 1 and 2.

The slide link between the chassis 20 and the support 30 is provided by six slide-forming devices disposed between the chassis and the support. These comprise two lower slides 37 designed to bear the weight of the support 30 in translational movement and four slides 38 designed to laterally guide the support 30 in the chassis 20.

The slides 38 are each composed of a rail 38A which is fastened relative to the chassis 20 and of a rail 38B, fastened to the support 30 and mounted to form a slide link with the rail 38A.

Advantageously, the slides 38 have stop forming means (not shown) to limit the translational movement of the support 30 relative to the chassis 20.

Similarly, the slides 37 are also each composed of a rail 37A which is fastened relative to the chassis 20 and of a rail 37B, fastened to the support 30 and mounted to form a slide link with the rail 37A.

As is known per se to the person skilled in the art, the rails 37A, 37B, 38A, 38B may comprise components reducing the friction between the rails such as ball bearings or skids formed from a material having a particularly suitable coefficient of friction such as for example Teflone®. Each of the locations 31 comprises, on its lateral walls, guide means configured in the present example to receive hard disks 40 in translational movement so as to ensure that they will come to be electrically connected with the connector 32 when they are inserted in each of the locations 31. In the present example they are rails 36 dimensioned to guide commercially available 2.5' hard disks.

Thus, as can be seen more particularly in FIG. 2, the blade 10 according to the invention makes it possible to considerably increase the quantity of components 40 that may be interchanged without having to disconnect the blade from the case of the computer system. For a blade having the same outside dimensions, the present invention provides twelve locations 31 accessible from the outside without having to demount the blade, whereas in the known solution having front compartments, the number of equivalent compartments was limited to six. Thus the density of the hot-interchangeable computer components, here 2.5' hard disks available on the market, is doubled with the blade according to the invention. The density of components in a single blade is substantially increased thereby.

As can be seen more particularly in FIG. 4, when it is desired to extract a component 40 from the support 30, it suffices to move it in translation relative to the chassis 20 like a drawer, with the aid of the slides 37 and 38. The ribbon 35 will follow this movement. The component 40 chosen may then easily be extracted from above as can be seen in FIG. 4.

The connector 34 is positioned here at the end closest to the connector 24 of the board 33.

Advantageously, in an embodiment not shown, the connector 34 is placed substantially at the center of the board 33 which reduces the length required for the ribbon 35 which improves the quality of the electrical signals and reduces the production cost.

Naturally, many modifications can be made to the embodiment described above without departing from the scope of the invention.

The invention claimed is:
1. A computer system comprising:
a computer system case;
at least one blade configured to be inserted into the computer system case;
at least one computer component configured to be mounted on said at least one blade:
wherein the at least one blade comprises:
  a chassis distinct from the computer system case and comprising a chassis connector configured to electrically couple the at least one blade to a connector of the computer system disposed in the computer system case;
  a support for the at least one computer component having a plurality of locations, each configured to receive the at least one computer component through translational movement in a longitudinal direction of the location, wherein the support is distinct from both the computer system case and the chassis of the at least one blade, wherein the locations comprise translation guiding rails to constrain the movement of the computer component, wherein each of the locations comprises a location connector electrically connected to the chassis connector, wherein each location connector is configured to electrically connect the computer component at the time of its insertion into the location to the chassis connector;
  a ribbon of electrical wires electrically directly connecting the location connectors to an intermediate connector;
  a control device for the computer components mounted on the chassis and bearing both the intermediate connector and the chassis connector for connecting the computer components to the chassis connector by the intermediary of the intermediate connector;
  at least one electronic board comprising one or more of the location connectors and being disposed on an internal face of the support between the computer components and the internal face;
  wherein the support is movably mounted via a slide link to the chassis, and is movable between a first position in which the support is substantially inserted into the chassis and a second position in which the support is at least partly extracted from the chassis, wherein in the second position, at least one of the locations is exposed such that the at least one computer component for the at least one location can be inserted or extracted by translational movement in the longitudinal direction;
  wherein the slide link is disposed between the chassis and the support and comprises a plurality of lower slides, each lower slide having a first rail fastened to the chassis and a second rail fastened to a lower surface of the support, the lower slides bearing the weight of the support in translational movement, and a plurality of lateral slides, each lateral slide having a first rail fastened to the chassis and a second rail fastened to a side surface of the support, the lateral slides laterally guiding the support in the chassis and being distinct from the lower slides, and
  wherein the ribbon of electrical wires is disposed at a bottom portion of the chassis so that the ribbon of electrical wires is arranged between the plurality of lower slides and a lower side of the chassis when the support moves between the first and second positions.

2. The computer system according to claim 1, wherein the longitudinal directions of the locations are substantially parallel to each other.

3. The computer system according to claim 1, wherein the slide link comprises a stop configured to limit the travel of the support relative to the chassis.

4. The computer system according to claim 1, wherein the received computer component of at least one of the locations comprises a hard disk.

5. The computer system according to claim 1, wherein the received computer component of at least one of the locations comprises an electronic board.

6. The computer system according to claim 1, wherein the ribbon of electrical wires is connected to the at least one electronic board via a board connector provided on the at least one electronic board.

7. The computer system according to claim 6, wherein the board connector is provided substantially at a center of the at least one electronic board.

\* \* \* \* \*